United States Patent
Min

(10) Patent No.: US 9,863,039 B2
(45) Date of Patent: Jan. 9, 2018

(54) $MOS_2$ THIN FILM AND METHOD FOR MANUFACTURING SAME

(71) Applicant: KONKUK UNIVERSITY INDUSTRIAL COOPERATION CORP., Seoul (KR)

(72) Inventor: Yo-Sep Min, Gyeonggi-do (KR)

(73) Assignee: KONKUK UNIVERSITY INDUSTRIAL COOPERATION CORP., Seoul (KR)

( * ) Notice: Subject to any disclaimer, the term of this patent is extended or adjusted under 35 U.S.C. 154(b) by 0 days.

(21) Appl. No.: 14/908,863

(22) PCT Filed: Aug. 13, 2013

(86) PCT No.: PCT/KR2013/007299
§ 371 (c)(1),
(2) Date: Jan. 29, 2016

(87) PCT Pub. No.: WO2015/016412
PCT Pub. Date: Feb. 5, 2015

(65) Prior Publication Data
US 2016/0168694 A1 Jun. 16, 2016

(30) Foreign Application Priority Data
Jul. 31, 2013 (KR) .......................... 10-2013-0090880

(51) Int. Cl.
*C23C 16/30* (2006.01)
*C01G 39/06* (2006.01)
(Continued)

(52) U.S. Cl.
CPC ............ *C23C 16/305* (2013.01); *C01G 39/06* (2013.01); *C23C 16/44* (2013.01);
(Continued)

(58) Field of Classification Search
CPC .................................................. C23C 16/305
See application file for complete search history.

(56) References Cited

U.S. PATENT DOCUMENTS 4,992,305 A * 2/1991 Erbil ..................... C07F 9/00
427/226
2006/0121271 A1 6/2006 Frey et al.
(Continued)

FOREIGN PATENT DOCUMENTS

| KR | 10-0809000 | 3/2008 |
| KR | 10-2012-0058723 | 6/2012 |
| WO | WO 2011/056519 | * 5/2011 |

OTHER PUBLICATIONS

Wang, H., et al., "Large-scale 2D Electronics based on Single-layer MoS2 Grown by Chemical Vapor Deposition," IEEE Tech. Dig. IEDM, 88-91 (2012).
(Continued)

*Primary Examiner* — Douglas B Call
(74) *Attorney, Agent, or Firm* — Duane Morris LLP; Gregory M. Lefkowitz; Jason M. Nolan

(57) ABSTRACT

The present disclosure relates to a $MoS_2$ thin film and a method for manufacturing the same. The present disclosure provides a $MoS_2$ thin film and a method for manufacturing the same using an atomic layer deposition method. In particular, the $MoS_2$ thin film is manufactured by an atomic layer deposition method without using a toxic gas such as $H_2S$ as a sulfur precursor. Thus, the present disclosure is eco-friendly. Furthermore, it is possible to prevent the damage and contamination of manufacturing equipment during the manufacturing process. In addition, it is possible to manufacture the $MoS_2$ thin film by precisely controlling the thickness of the $MoS_2$ thin film to the level of an atomic layer.

8 Claims, 5 Drawing Sheets

(51) Int. Cl.
*C23C 16/455* (2006.01)
*C23C 16/44* (2006.01)

(52) U.S. Cl.
CPC .. *C23C 16/45527* (2013.01); *C23C 16/45553* (2013.01); *C23C 16/45555* (2013.01)

(56) References Cited

U.S. PATENT DOCUMENTS

| | | |
|---|---|---|
| 2008/0119098 A1 | 5/2008 | Palley et al. |
| 2012/0318357 A1* | 12/2012 | Fujdala ............... H01L 31/0256 136/262 |
| 2012/0329208 A1 | 12/2012 | Pore et al. |

OTHER PUBLICATIONS

Wang, Q. H. et al., "Electronics and optoelectronics of two-dimensional transition metal dichalcogenides," Nature Nanotechnology 2012, 7, 699-712.

Chhowalla, M. et al., "The chemistry of two-dimensional layered transition metal dichalcogenide nanosheets," Nature Chemistry 2013, 5, 263-275.

\* cited by examiner

[Fig. 1]
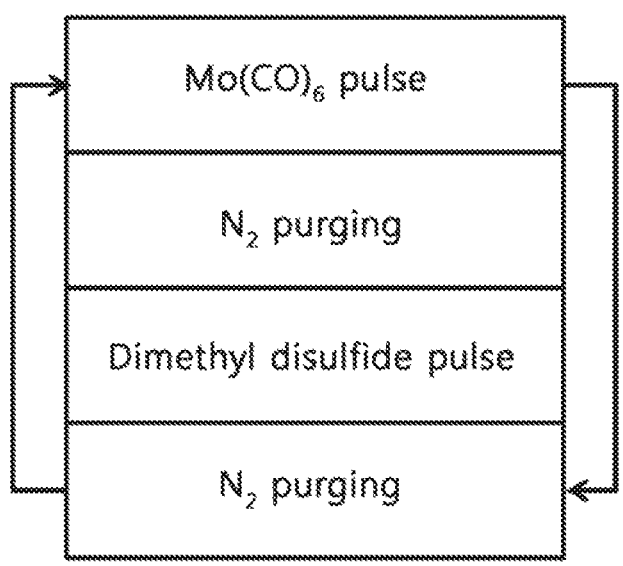

[Fig. 2]
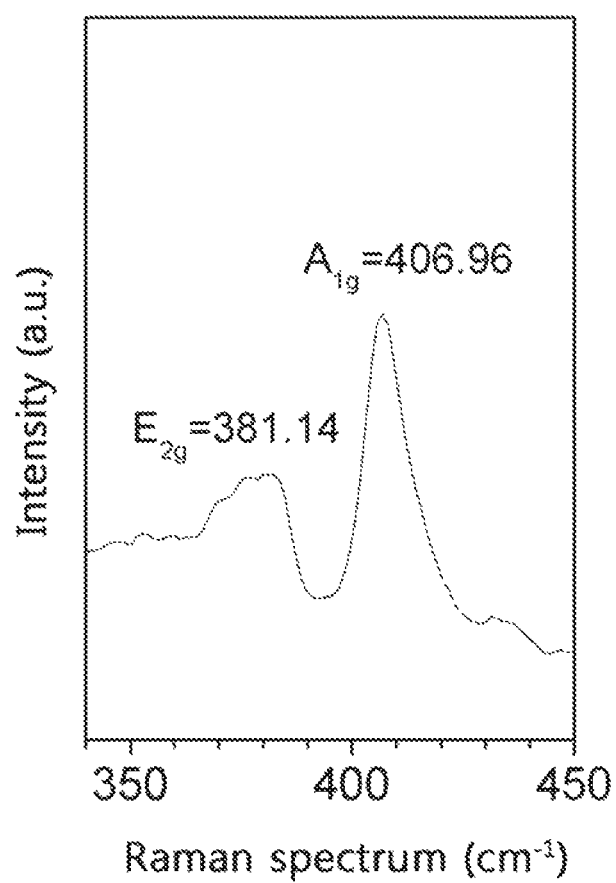

[Fig. 3a]
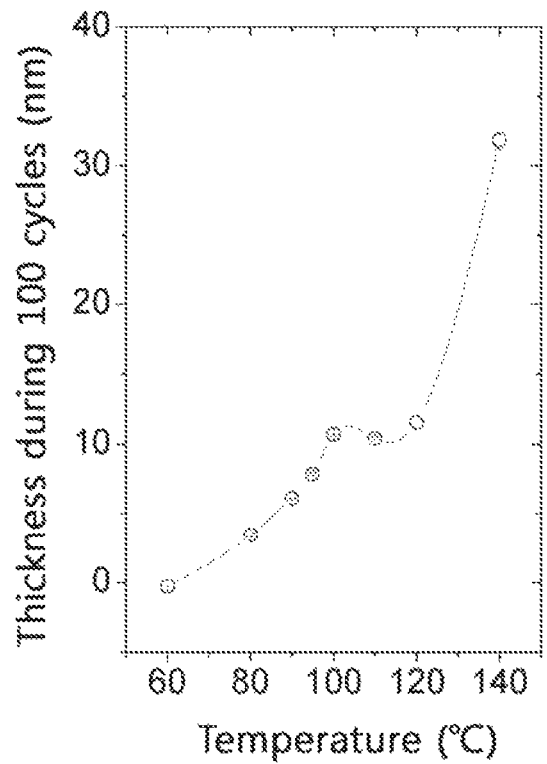
[Fig. 3b]
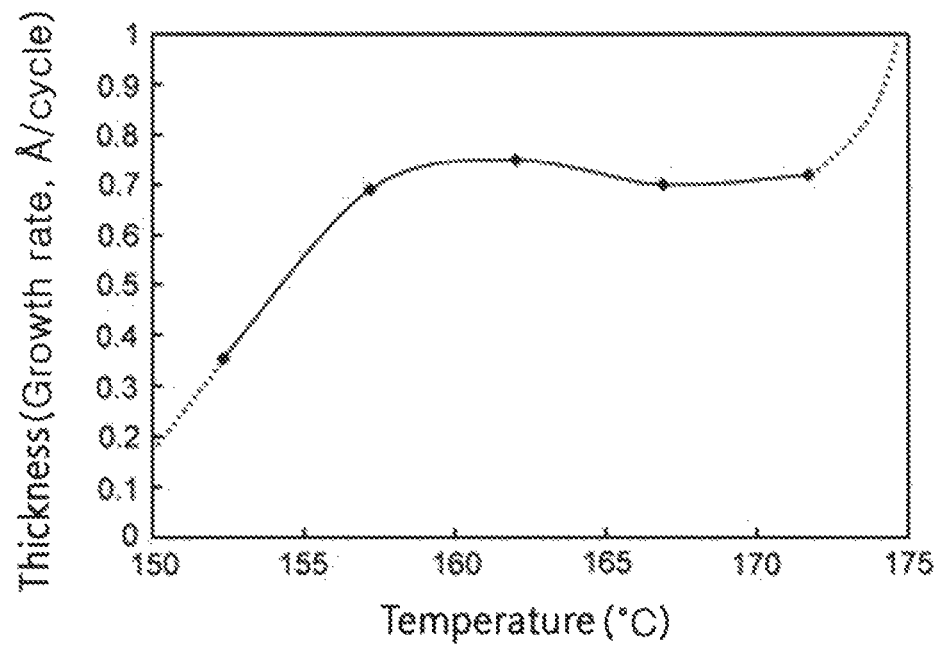

[Fig. 4a]
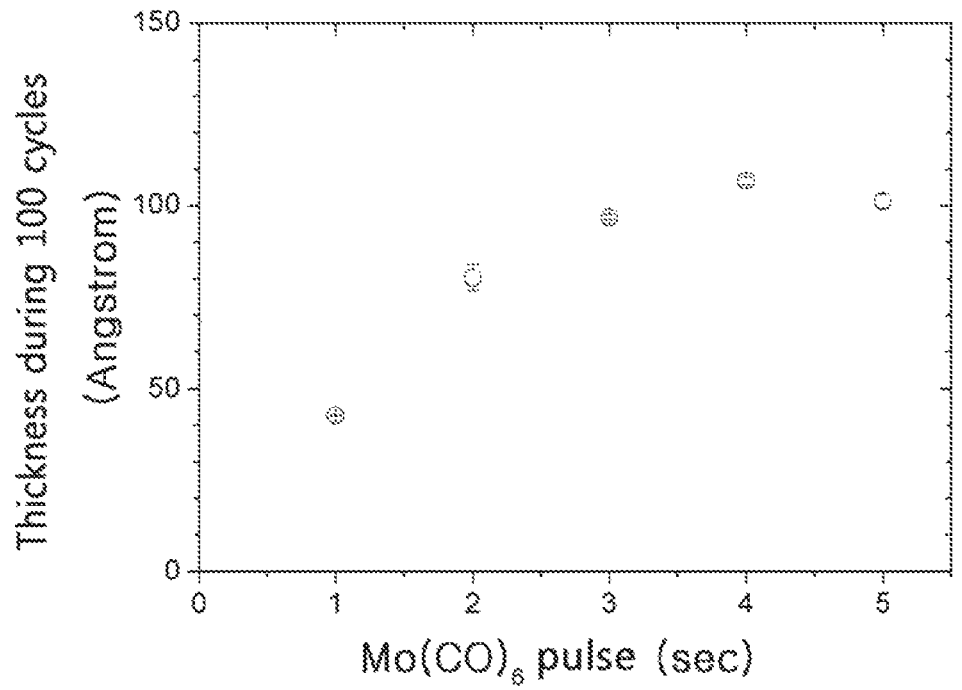
[Fig. 4b]
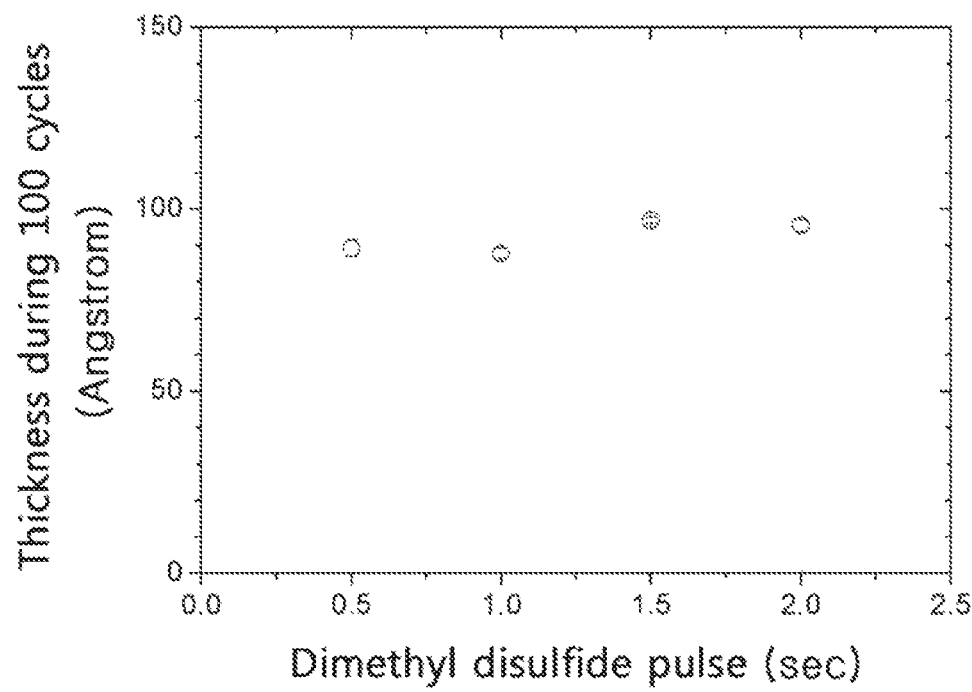

[Fig. 5]
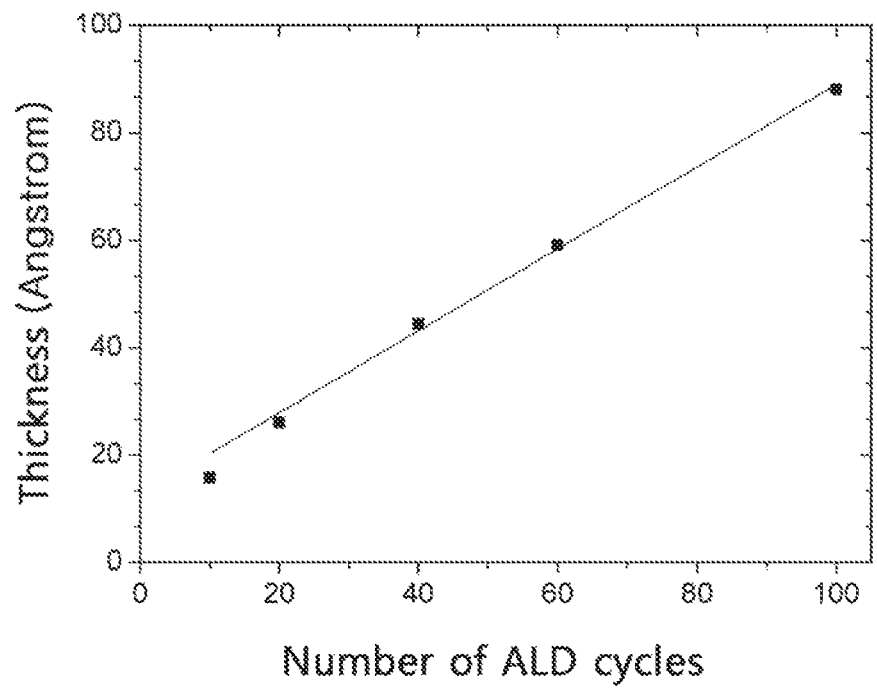
[Fig. 6]
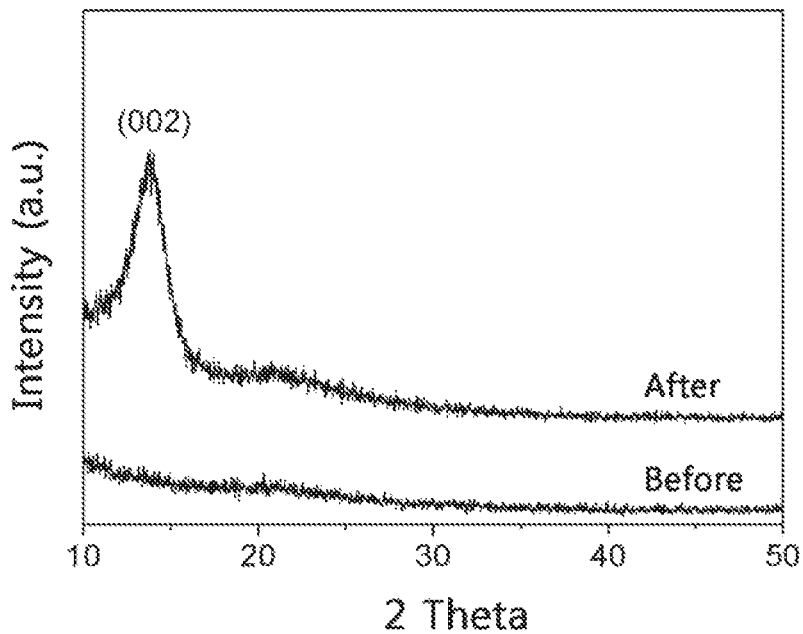

ized as a semiconductor active layer for a transistor # $MoS_2$ THIN FILM AND METHOD FOR MANUFACTURING SAME

CROSS-REFERENCE TO RELATED APPLICATIONS

This application is a §371 national stage entry of International Application No. PCT/KR2013/007299, filed Aug. 13, 2013, which claims priority to South Korean Patent Application No. 10-2013-0090880, filed on Jul. 31, 2013, the entire contents of which are incorporated herein by reference.

TECHNICAL FIELD

The present disclosure relates to a $MoS_2$ thin film and method for manufacturing the same.

BACKGROUND ART

Transition metal chalcogenides have layered structures similar to that of graphite. In particular, $MoS_2$ is drawing attentions as a semiconductor active layer for a transistor that can replace graphene and as a hydrogen evolution reaction catalyst that can replace platinum. Also, $MoS_2$ is being studied as an electrode material of a lithium-ion battery because it has a layered structure allowing easy intercalation and extraction of lithium ions [Chhowalla, M. et al., *Nature Chemistry* 2013, 5, 263-275].

A bulk $MoS_2$ single crystal has an indirect band gap of 1.3 eV unlike graphene and has a superior mobility of 50-200 $cm^2/Vs$ at room temperature. Since it has a direct band gap of 1.8 eV when the thickness decreases to the scale of a single atomic layer, researches are actively carried out to make it into a thin film for use as an active layer of a transistor [Wang, Q. H. et al., *Nature Nanotechnology* 2012, 7, 699-712]. Most recently, it has been known that a thin film prepared from monolayer, bilayer or multilayer $MoS_2$ has a mobility close to that of bulk $MoS_2$.

As methods for manufacturing $MoS_2$ thin films, exfoliation of detaching an atomic layer from a $MoS_2$ single crystal and chemical vapor deposition of depositing $MoS_2$ on, e.g., a substrate at high temperature using Mo (or $MoO_3$) and sulfur as precursors are being studied. However, these methods are inapplicable to large-scale production processes (particularly, semiconductor processes). In addition, the chemical vapor deposition method is limited in that it is difficult to control the number of atomic layers.

MIT's Wang, H. et al. reported in *IEEE Tech. Dig. IEDM*, 88-91 (2012) (non-patent document 1) that a $MoS_2$ atomic layer for a transistor prepared at 650° C. using $MoO_3$ and S (elemental sulfur) as precursors has a mobility of approximately 190 $cm^2/Vs$. However, because the precursors used are solids and have very low vapor pressures, the chemical vapor deposition method is not applicable to large-scale production due to contamination of equipment such as a vacuum chamber.

Although the atomic layer deposition method (ALD) of growing a thin film trough chemical adsorption of precursors is the best suited method for growing atomic layers, it is not utilized for the growth of thin film or monolayer of layered transition metal sulfides such as $MoS_2$. In the atomic layer deposition method, atomic layers are formed from chemical adsorption between the precursors and surface functional groups. A thin film is formed by chemically adsorbing two different precursors alternatingly. In general, the atomic layer deposition method using two precursors consists of cycles each consisting of adsorption of a first precursor and purging and adsorption of a second precursor and purging. The thickness of the thin film can be controlled in the scale of atomic layers by controlling the number of cycle.

Although it is expected that a thin film of $MoS_2$ can be formed by the atomic layer deposition method because it consists of only two elements of Mo (molybdenum) and S (sulfur), the growth of $MoS_2$ thin film by the atomic layer deposition method has not been reported yet due to the absence of a suitable precursor. In particular, although $MoF_6$, $MoCl_6$, $Mo(CO)_6$, etc. are known as Mo precursors, no suitable sulfur precursor has been designed. Although use of $H_2S$ as the sulfur precursor may be considered as $H_2O$ is used as an oxygen precursor, the $H_2S$ gas is not applicable to a large-scale production process due to its toxicity, corrosiveness and explosiveness.

DISCLOSURE

Technical Problem

The present disclosure is directed to providing a $MoS_2$ thin film and a method for manufacturing the same. In particular, it is directed to providing a sulfur precursor for forming the $MoS_2$ thin film by an atomic layer deposition method, which is neither a solid nor a toxic gas. Therefore, the present disclosure is directed to providing a method for manufacturing a $MoS_2$ thin film, which can be applied for an industrial process with high efficiency and can form the $MoS_2$ thin film without contaminating the manufacturing equipment. The present disclosure is also directed to providing a method for manufacturing a $MoS_2$ thin film whose thickness is controllable.

Technical Solution

In an aspect, the present disclosure provides a $MoS_2$ thin film which is formed from a molybdenum precursor and a sulfur precursor and grown by an atomic layer deposition method.

In another aspect, the present disclosure provides a method for manufacturing a $MoS_2$ thin film, including:

1) a step of forming a chemical functional group layer containing Mo on a substrate by supplying a molybdenum precursor into a reactor in vacuum state;

2) a step of removing an excess molybdenum precursor that has not formed the chemical functional group layer containing Mo and a byproduct by supplying an inert gas into the reactor after the step 1);

3) a step of forming a $MoS_2$ atomic layer by chemically adsorbing a sulfur precursor on the chemical functional group layer containing Mo by supplying the sulfur precursor into the reactor; and 4) a step of removing a sulfur precursor that has not been adsorbed in the step 3) and a byproduct by supplying an inert gas into the reactor after the step 3).

Advantageous Effects

The present disclosure provides a $MoS_2$ thin film and a method for manufacturing the same using an atomic layer deposition method. In particular, the present disclosure is eco-friendly because the $MoS_2$ thin film is manufactured by an atomic layer deposition method without using a toxic gas such as $H_2S$ as a sulfur precursor. Furthermore, it is possible to prevent the damage and contamination of manufacturing equipment during the manufacturing process. In addition, it is possible to manufacture the $MoS_2$ thin film by precisely controlling the thickness of the $MoS_2$ thin film to the level of an atomic layer.

BRIEF DESCRIPTION OF DRAWINGS

FIG. 1 schematically shows a process of manufacturing a $MoS_2$ thin film by an atomic layer deposition method using $Mo(CO)_6$ and dimethyl disulfide according to an exemplary embodiment of the present disclosure.

FIG. 2 shows the Raman spectrum of a $MoS_2$ thin film manufactured according to the present disclosure.

FIG. 3a shows the thickness of a $MoS_2$ thin film manufactured by an atomic layer deposition method using $Mo(CO)_6$ and dimethyl disulfide during 100 cycles as a function of deposition temperature.

FIG. 3b shows the growth rate of a $MoO_3$ thin film manufactured by an atomic layer deposition method using $Mo(CO)_6$ as a Mo precursor and a mixture gas of $O_3$ and $H_2O$ as an oxygen precursor as a function of deposition temperature (Diskus, M. et al., *J. Mater. Chem.* 2011, 21, 705-710).

FIG. 4a shows the thickness of a thin film manufactured by an atomic layer deposition method using $Mo(CO)_6$ and dimethyl disulfide as a function of $Mo(CO)_6$ supply time.

FIG. 4b shows the thickness of a thin film manufactured by an atomic layer deposition method using $Mo(CO)_6$ and dimethyl disulfide as a function of dimethyl disulfide supply time.

FIG. 5 shows the linear increase of the thickness of a thin film manufactured by an atomic layer deposition method using $Mo(CO)_6$ and dimethyl disulfide as a function of cycle number.

FIG. 6 shows the improvement of the crystallinity of a $MoS_2$ thin film grown by an atomic layer deposition method after heat treatment.

BEST MODEL

The inventors of the present disclosure have researched to find a sulfur precursor capable of providing a $MoS_2$ thin film with a controllable thickness by an atomic layer deposition method, which is neither a solid nor a toxic gas. As a result, they have found out the $MoS_2$ thin film and the method for manufacturing the same according to the present disclosure.

Specifically, the $MoS_2$ thin film according to the present disclosure is formed from a molybdenum precursor and a sulfur precursor and is grown by an atomic layer deposition method.

The $MoS_2$ is well known as a layered transition metal sulfide. In the present disclosure, because the $MoS_2$ is grown by an atomic layer deposition method, the thickness of the thin film of the number of the $MoS_2$ atomic layers can be controlled precisely in angstrom scale by controlling the number of deposition cycles. Accordingly, the $MoS_2$ thin film may be formed as a monolayer by an atomic layer deposition method. When the $MoS_2$ monolayer is formed by an atomic layer deposition method rather than by other deposition methods such as chemical vapor deposition, the $MoS_2$ monolayer may be formed more conveniently at lower cost in an industrial process for producing the thin film. In addition, unlike the general chemical vapor deposition method, the $MoS_2$ monolayer can be formed uniformly on a large area by the atomic layer deposition method.

Specifically, when forming the $MoS_2$ thin film, the sulfur precursor may not be a toxic gas such as $H_2S$. And, specifically, it may not be a solid such as sulfur for more appropriate application to a manufacturing process. That is to say, a sulfur precursor which does not emit a toxic gas and is not a solid may be used without particular limitation. Most specifically, a dialkyl disulfide or a dihalodisulfide which is liquid at room temperature may be used as the sulfur precursor for forming the $MoS_2$ thin film. When a dialkyl disulfide or a dihalodisulfide is used as the sulfur precursor, the $MoS_2$ thin film can be formed through a safe and eco-friendly manufacturing process because no toxic gas is used in the process. In addition, because the liquid precursors are easily evaporated at room temperature as compared to solid sulfur which has a low vapor pressure, superior manufacturing efficiency can be achieved as the damage to the manufacturing equipment can be prevented.

In general, when a thin film is deposited by an atomic layer deposition method, a temperature range occurs wherein the deposition rate does not change with the deposition temperature. This is called the ALD temperature window. This temperature range usually occurs at 400° C. or lower although there may be differences depending on the precursors used.

As a specific example, when a $MoS_2$ thin film is deposited by an atomic layer deposition method using dimethyl disulfide as the sulfur precursor and $Mo(CO)_6$ as a Mo precursor, the ALD temperature window occurs at 100-120° C. (FIG. 3a).

When the deposition temperature during the atomic layer deposition is below 100° C., the thickness of the thin film decreases because the precursors are not chemically adsorbed satisfactorily. And, when the deposition temperature during the atomic layer deposition is higher than 120° C., the thickness of the thin film increases rapidly due to thermal decomposition of the molybdenum precursor.

In the present disclosure, the molybdenum precursor is not particularly limited as long as it is one that contains molybdenum and is useable as a precursor. Specifically, it may be one or more selected from a group consisting of $Mo(CO)_6$, $MoF_6$ and $MoCl_6$.

As described above, the $MoS_2$ thin film according to the present disclosure is formed by an atomic layer deposition method. During the deposition, chemical functional groups containing Mo are formed on the surface of a substrate through chemical adsorption as the molybdenum precursor is deposited. Then, the surface is saturated with chemical functional groups containing sulfur as the sulfur precursor is chemically adsorbed. As the adsorption reactions are repeated, $MoS_2$ is grown by an ALD process.

The Raman spectrum of the $MoS_2$ thin film obtained using a 532-nm laser has peaks observed at 375-385 $cm^{-1}$ and 400-410 $cm^{-1}$, as shown in FIG. 2.

The $MoS_2$ thin film may be used as a semiconductor active layer thin film of a transistor, as a catalyst for hydrogen evolution reaction, or as an electrode material of a lithium-ion battery.

The present disclosure also provides a method for manufacturing a $MoS_2$ thin film, including:

1) a step of forming a chemical functional group layer containing Mo on a substrate by supplying a molybdenum precursor into a reactor in vacuum state;

2) a step of removing an excess molybdenum precursor that has not formed the chemical functional group layer containing Mo and a byproduct by supplying an inert gas into the reactor after the step 1);

3) a step of forming a $MoS_2$ atomic layer by chemically adsorbing a sulfur precursor on the chemical functional group layer containing Mo by supplying the sulfur precursor into the reactor; and 4) a step of removing a sulfur precursor that has not been adsorbed in the step 3) and a byproduct by supplying an inert gas into the reactor after the step 3).

Specifically, the sulfur precursor in the step 2) may be a dialkyl disulfide or a dihalodisulfide.

The substrate in the step 1) is not particularly limited as long as it is one that can be used for atomic layer deposition and has thermal stability in the ALD temperature window. Specifically, one or more selected from a group consisting of a wafer such as Si, sapphire, etc., glass, a polymer film, an alumina or silica powder/support, etc. may be used.

The molybdenum precursor in the step 1) is not particularly limited as long as it is one that contains molybdenum and is useable as a precursor. Specifically, it may be one or more selected from a group consisting of $Mo(CO)_6$, $MoF_6$ and $MoCl_6$.

The reactor in the step 1) is not particularly limited as long as it is one that can be used for atomic layer deposition.

When supplying the molybdenum precursor in the step 1), the supply pressure is not particularly limited as long as the chemical functional group layer containing Mo is formed and the $MoS_2$ thin film is formed by the chemical adsorption of the sulfur precursor in the step 3). Specifically, the supply pressure may be 0.1-10 Torr. When the molybdenum precursor has a low vapor pressure, it may be supplied by using an inert gas such as nitrogen as a carrier gas. When the supply pressure of the molybdenum precursor is lower than 0.1 Torr, the chemical functional group layer containing Mo may not be formed sufficiently. And, when the supply pressure of the molybdenum precursor is higher than 10 Torr, it is economically undesirable because excess molybdenum precursor is supplied.

The inert gas supplied in the step 2) or in the step 4) is not particularly limited as long as it is an element in the group 18 of the periodic table or a gas that can safely remove the excess molybdenum precursor or sulfur precursor through purging. As specific examples, nitrogen ($N_2$), argon (Ar), etc. can be used. Alternatively, without using an additional purging gas, the step 2) and the step 4) may be replaced by a vacuum purging step of removing the excess precursors and the byproduct in vacuo. In the step 2) or the step 4), the supply pressure of the inert gas is not particularly limited as long as the amount of the inert gas is sufficient to remove the molybdenum precursor that has not formed the chemical functional group layer containing Mo in the step 1) or the sulfur precursor that has not been chemically adsorbed in the step 3). Specifically, it may be supplied at a pressure of 0.5-5 Torr.

Specifically, the sulfur precursor in the step 3) may be a dialkyl disulfide or a dihalodisulfide. When a dialkyl disulfide or a dihalodisulfide is used as the sulfur precursor, the $MoS_2$ thin film can be manufactured through a safe and eco-friendly manufacturing process.

The chemical adsorption of the sulfur precursor on the chemical functional group layer containing Mo in the step 3) is accomplished by atomic layer deposition. Specifically, chemical functional groups containing Mo are formed on the surface of the substrate through chemical adsorption as the molybdenum precursor is deposited. Then, the surface is saturated with chemical functional groups containing sulfur as the sulfur precursor is chemically adsorbed. As the adsorption reactions are repeated, $MoS_2$ is grown by an ALD process.

When supplying the sulfur precursor in the step 3), the supply pressure is not particularly limited as long as chemical adsorption can occur on the chemical functional group layer containing Mo formed in the step 1). Specifically, the supply pressure may be 0.1-10 Torr. When the sulfur precursor has a low vapor pressure, it may be supplied by using an inert gas such as nitrogen as a carrier gas. When the supply pressure of the sulfur precursor is lower than 0.1 Torr, chemical adsorption may not occur sufficiently on the chemical functional group layer containing Mo. And, when the supply pressure of the sulfur precursor is higher than 10 Torr, it is economically undesirable because excess sulfur precursor will remain without being chemically adsorbed.

Specifically, the formation of the $MoS_2$ thin film according to the present disclosure is accomplished in a temperature range corresponding to the ALD temperature window. At a temperature lower than the temperature range, the growth rate of the thin film is slow because the chemical adsorption of the precursors is insufficient and the thickness decreases. And, at a temperature higher than the temperature range, the thickness of the thin film increases rapidly due to thermal decomposition of the molybdenum precursor.

In the step 1), the molybdenum precursor should be supplied for a sufficient time such that the surface functional groups are saturated by the chemical adsorption of the molybdenum precursor. In a specific exemplary embodiment, when $Mo(CO)_6$ and dimethyl disulfide are used, the supply time of $Mo(CO)_6$ in the atomic layer deposition may be 3 seconds or longer, as shown in FIG. 4a.

And, in the step 3), the sulfur precursor should be supplied for a sufficient time such that the functional groups containing molybdenum prepared in the step 2) are saturated by the chemical adsorption of the sulfur precursor. In a specific exemplary embodiment, when $Mo(CO)_6$ and dimethyl disulfide are used, the supply time of dimethyl disulfide in the atomic layer deposition may be 0.5-5 seconds, as shown in FIG. 4b.

Specifically, in the step 4), the sulfur precursor that has not been adsorbed in the step 3) and the byproduct may be removed by supplying the inert gas.

The steps 1) through 4) may be repeated. As the steps 1) through 4) are repeated, the thickness of the $MoS_2$ thin film is increased as shown in FIG. 5. Because the thickness of the $MoS_2$ thin film is determined by the repeat number of the steps 1) through 4), the thickness of the $MoS_2$ thin film can be controlled precisely. Accordingly, the thickness of the $MoS_2$ thin film or the number of the $MoS_2$ atomic layers can be controlled precisely in angstrom scale by controlling the number of deposition cycles.

After repeating the steps 1) through 4), a heat treatment step may be further included to improve the crystallinity of the thin film. Specifically, the heat treatment may be performed at 400-1,000° C. When the heat treatment temperature is below 400° C., crystallization does not occur. And, when the heat treatment is higher than 1,000° C., molybdenum and sulfur may undesirably diffuse to the lower film.

The Raman spectrum of the $MoS_2$ thin film manufactured according to the present disclosure has peaks observed at 375-385 $cm^{-1}$ and 400-410 $cm^{-1}$.

The manufactured $MoS_2$ thin film may be utilized as a semiconductor active layer thin film of a transistor, as a catalyst for hydrogen evolution reaction, or as an electrode material of a lithium-ion battery.

Because the $MoS_2$ thin film is formed by an atomic layer deposition method in the method for preparing a $MoS_2$ thin film according to the present disclosure, the $MoS_2$ thin film may be formed as a monolayer. If $MoS_2$ is formed as a monolayer by atomic layer deposition, the number of the layers can be controlled precisely by controlling the number of cycles. Accordingly, uniform monolayer MoS$_2$ can be provided on a large area regardless of the size of the substrate.

As described above, when a MoS$_2$ thin film is prepared by the method for manufacturing a MoS$_2$ thin film according to the present disclosure, the MoS$_2$ thin film may be provided by a safe and eco-friendly atomic layer deposition method and its thickness and the number of atomic layers may be controlled precisely by controlling the number of cycles.

MODE FOR INVENTION

Hereinafter, the present disclosure will be described in detail through examples. However, the following examples are for illustrative purposes only and it will be apparent to those of ordinary skill in the art that the scope of the present disclosure is not limited by the examples.

EXAMPLE

Molybdenum hexacarbonyl (Mo(Co)$_6$, Aldrich) was prepared as a molybdenum precursor for atomic layer deposition. And, dimethyl disulfide (CH$_3$S$_2$CH$_3$, Aldrich) was prepared as a sulfur precursor. High-purity nitrogen (N$_2$, 99.999%) was prepared as a purging gas. And, a SiO$_2$ (300 nm)/Si wafer was prepared as a substrate.

The molybdenum hexacarbonyl (Mo(Co)$_6$) was supplied into a reactor containing the Si wafer in vacuum state using high-purity nitrogen as a carrier gas. The pressure inside the reactor was maintained at about 1.43 Torr. The molybdenum precursor supply time was 1 second, 2 seconds, 3 seconds, 4 seconds and 5 seconds, respectively. The high-purity nitrogen (N$_2$) was supplied at a pressure of 1.75 Torr as a purging gas to remove excess molybdenum hexacarbonyl (Mo(Co)$_6$) and a byproduct. After the purging process using nitrogen, the dimethyl disulfide was supplied into the reactor at a pressure of 1.1 Torr. The sulfur precursor supply time was 0.5 second, 1 second, 1.5 seconds and 2 seconds, respectively. Then, the excess sulfur precursor remaining unreacted was removed by supplying the high-purity nitrogen at a pressure of 1.75 Torr. During these processes, the temperature inside the reactor was maintained constant at 60, 80, 90, 95, 100, 110, 120 and 140° C., respectively.

This procedure is schematically shown in FIG. 1. A MoS$_2$ thin film was manufactured by repeating this procedure. The thickness of the thin films manufactured by performing 100 cycles at different deposition temperatures is shown in FIG. 3a.

The sample grown through this procedure was put in a chamber equipped with a lamp heater and heat-treated at 485° C. for 2 hours.

Comparative Example

A MoO$_3$ thin film was manufactured in the same manner as in Example, except that ozone (O$_3$) was used instead of the sulfur precursor.

Test Example

Test Example 1: Measurement of Raman Spectrum

The Raman spectrum of the MoS$_2$ thin film manufactured in Example was measured using a 532-nm laser. The result is shown in FIG. 2.

As can be seen from FIG. 2, the in-plane vibration and out-of-plane vibration peaks of MoS$_2$ were observed at 381.14 cm$^{-1}$ and 406.96 cm$^{-1}$, respectively. Through this, it was confirmed that the MoS$_2$ thin film manufactured in Example corresponds to MoS$_2$ (2H phase).

Test Example 2: Comparison of Effect of Deposition Temperature

The thickness of the thin films of Example and Comparative Example manufactured at different deposition temperatures of 50-150° C. was observed. The result is shown in FIGS. 3a and 3b.

As can be seen from the figures, the MoS$_2$ thin films of Example (FIG. 3a) showed an ALD temperature window of 100-120° C. where the thickness of the thin film is maintained constant without significant change despite the change in temperature. In contrast, the MoO$_3$ thin films of Comparative Example (FIG. 3b) showed a different ALD temperature window of 157-172° C. That is to say, it was also found out that the ALD temperature window is formed at a higher temperature range in Comparative Example than in Example.

In addition, a result of monitoring the change in film thickness as a function of the supply time of the molybdenum precursor and the sulfur precursor during 100 cycles is shown in FIGS. 4a and 4b. For the molybdenum precursor which forms a Mo layer (FIG. 4a), the film thickness increased consistently until 3 seconds and then remained constant without significant change thereafter. In contrast, for the sulfur precursor (FIG. 4b), which is liquid at room temperature but has good volatility, it was saturated through chemical adsorption in very short supply time.

The thickness of the MoS$_2$ thin film of Example can be controlled in atomic layer scale because it is formed through repeated cycles. As seen from FIG. 5, the thickness increases linearly with the cycle number and, therefore, a thin film with desired thickness can be manufactured as desired. That is to say, the thickness of the MoS$_2$ thin film of Example can be controlled by controlling the cycle number during the manufacturing process.

Test Example 3: Comparison of Effect of Heat Treatment

It was investigated whether the crystallinity of the MoS$_2$ thin film of Example can be improved through heat treatment. The manufactured sample was put in a chamber equipped with a lamp heater and heat-treated at 485° C. for 2 hours. The result is shown in FIG. 6.

As can be seen from FIG. 6, the MoS$_2$ (002) peak appeared prominently after the heat treatment. The peak was not observed before the heat treatment because of poor crystallinity. Accordingly, it is desired that heat treatment be conducted. Specifically, the heat treatment may be conducted at 400-1,000° C.

Those skilled in the art will appreciate that the conceptions and specific embodiments disclosed in the foregoing description may be readily utilized as a basis for modifying or designing other embodiments for carrying out the same purposes of the present disclosure. Those skilled in the art will also appreciate that such equivalent embodiments do not depart from the spirit and scope of the disclosure as set forth in the appended claims.

The invention claimed is:

1. A method for manufacturing a MoS$_2$ thin film, the method comprising:

1) forming a chemical functional group layer comprising Mo on a substrate by supplying a molybdenum precursor into a reactor in vacuum state;
2) removing an excess molybdenum precursor that has not formed the chemical functional group layer comprising Mo and a byproduct by supplying an inert gas into the reactor after 1);
3) forming a $MoS_2$ atomic layer by chemically adsorbing a sulfur precursor on the chemical functional group layer comprising Mo by supplying the sulfur precursor into the reactor; and
4) removing a sulfur precursor that has not been adsorbed in 3) and a byproduct by supplying an inert gas into the reactor after 3);
wherein the molybdenum precursor is $Mo(CO)_6$ and the sulfur precursor is dimethyl disulfide, and
wherein the chemical adsorption of the sulfur precursor on the chemical functional group layer containing Mo in 3) is accomplished by atomic layer deposition (ALD) at a temperature of 100-120° C.

2. The method for manufacturing a $MoS_2$ thin film according to claim 1, wherein, in 1), the molybdenum precursor is supplied at a pressure of 0.1-10 Torr.

3. The method for manufacturing a $MoS_2$ thin film according to claim 1, wherein, in 3), the sulfur precursor is supplied at a pressure of 0.1-10 Torr.

4. The method for manufacturing a $MoS_2$ thin film according to claim 1, further comprising repeating 1) through 4).

5. The method for manufacturing a $MoS_2$ thin film according to claim 1, further comprising a heat treatment after 4).

6. The method for manufacturing a $MoS_2$ thin film according to claim 5, wherein the heat treatment after 4) is performed at 400-1,000° C.

7. The method for manufacturing a $MoS_2$ thin film according to claim 4, further comprising a heat treatment after a final repeat of 1) through 4).

8. The method for manufacturing a $MoS_2$ thin film according to claim 7, wherein the heat treatment after 4) is performed at 400-1,000° C.

* * * * *